United States Patent
Miyahara et al.

(10) Patent No.: US 9,084,385 B2
(45) Date of Patent: Jul. 14, 2015

(54) ELECTRONIC COMPONENT MOUNTING DEVICE AND WORK METHOD OF ELECTRONIC COMPONENT MOUNTING DEVICE

(75) Inventors: Seiichi Miyahara, Yamanashi (JP);
Nobuhiro Nakai, Yamanashi (JP);
Minoru Murakami, Yamanashi (JP);
Takahiro Fukagawa, Yamanashi (JP);
Takashi Yazawa, Yamanashi (JP);
Kimiyuki Yamasaki, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1167 days.

(21) Appl. No.: 13/062,050

(22) PCT Filed: Jun. 23, 2009

(86) PCT No.: PCT/JP2009/002876
§ 371 (c)(1),
(2), (4) Date: Mar. 3, 2011

(87) PCT Pub. No.: WO2010/026685
PCT Pub. Date: Mar. 11, 2010

(65) Prior Publication Data
US 2011/0162202 A1  Jul. 7, 2011

(30) Foreign Application Priority Data

Sep. 4, 2008 (JP) .................... 2008-226626

(51) Int. Cl.
*H05K 3/30* (2006.01)
*H05K 13/04* (2006.01)
(Continued)

(52) U.S. Cl.
CPC .......... *H05K 13/0465* (2013.01); *H05K 13/08* (2013.01); *H05K 3/1216* (2013.01); *Y10T 29/4913* (2015.01); *Y10T 29/53026* (2015.01)

(58) Field of Classification Search
CPC ....... H05K 3/30; H05K 13/04; Y10T 29/4913
USPC .......... 29/729, 739–744, 757–761, 832–841, 29/854–856, 709–719
See application file for complete search history.

(56) References Cited

U.S. PATENT DOCUMENTS 3,090,521 A * 5/1963 Fazekas ............................ 221/6
3,557,431 A * 1/1971 Koch et al. ................... 29/564.1
(Continued)

FOREIGN PATENT DOCUMENTS

| CN | 1893811 A | 1/2007 |
|---|---|---|
| JP | 07-323518 A | 12/1995 |

(Continued)

OTHER PUBLICATIONS

Chinese Office Action for Application No. 200980134478.0 dated Jun. 21, 2013.

(Continued)

*Primary Examiner* — Peter DungBa Vo
*Assistant Examiner* — Kaying Kue
(74) *Attorney, Agent, or Firm* — Pearne & Gordon LLP

(57) ABSTRACT

An object of the invention is to provide an electronic component mounting device and a work method of the electronic component mounting device, capable of ensuring safety of an operator who accesses a work line through a door portion, and avoiding reduction of workability. A space defined by a base (11) and a cover member (14) is partitioned by a partition member (15) to define a plurality of work line storing spaces (SP1). A plurality of work lines (12) are stored in the respective work line storing spaces (SP1) individually. When any of a plurality of door portions (14a) provided in the cover member (14) so as to allow an access to an inside of the respective work line storing spaces (SP1) is opened, an operation of a work line (12) stored in a work line storing space (SP1) accessible through the opened door portion (14a) is stopped.

3 Claims, 7 Drawing Sheets

(51) Int. Cl.
*H05K 13/08* (2006.01)
*H05K 3/12* (2006.01)

(56) References Cited

U.S. PATENT DOCUMENTS

| | | | | |
|---|---|---|---|---|
| 3,808,662 | A * | 5/1974 | Ragard | 29/712 |
| 4,202,092 | A * | 5/1980 | Shibasaki et al. | 29/741 |
| 4,362,486 | A * | 12/1982 | Davis et al. | 425/110 |
| 4,606,117 | A * | 8/1986 | Takahashi et al. | 29/740 |
| 4,657,158 | A * | 4/1987 | Faes et al. | 221/25 |
| 4,835,843 | A * | 6/1989 | Wendt et al. | 29/708 |
| 4,934,891 | A * | 6/1990 | Hawkswell | 414/223.01 |
| 5,035,047 | A * | 7/1991 | Harigane et al. | 29/740 |
| 5,093,982 | A * | 3/1992 | Gussman | 29/705 |
| 5,323,528 | A * | 6/1994 | Baker | 29/721 |
| 5,451,131 | A * | 9/1995 | Hecht et al. | 414/217.1 |
| 5,661,239 | A * | 8/1997 | Takeuchi | 73/432.1 |
| 6,141,869 | A * | 11/2000 | Crane et al. | 29/842 |
| 6,338,192 | B1 | 1/2002 | Kanai et al. | |
| 6,370,764 | B1 * | 4/2002 | Kinoshita et al. | 29/740 |
| 6,374,484 | B1 * | 4/2002 | Yoshida et al. | 29/740 |
| 6,490,781 | B2 * | 12/2002 | Kanai et al. | 29/708 |
| RE38,025 | E * | 3/2003 | Skunes et al. | 356/400 |
| 6,729,017 | B1 * | 5/2004 | Kashiwagi et al. | 29/740 |
| 6,857,173 | B1 * | 2/2005 | Crane et al. | 29/33 M |
| 6,892,447 | B1 * | 5/2005 | Yamauchi et al. | 29/740 |
| 7,003,872 | B2 * | 2/2006 | Mimura et al. | 29/832 |
| 7,036,212 | B2 * | 5/2006 | Kato et al. | 29/740 |
| 7,109,133 | B2 * | 9/2006 | Murata et al. | 438/800 |
| 7,137,194 | B2 * | 11/2006 | Theriault et al. | 29/832 |
| 7,272,887 | B2 * | 9/2007 | Van Gastel | 29/740 |
| 7,331,103 | B2 * | 2/2008 | Kakita et al. | 29/740 |
| 7,513,032 | B2 * | 4/2009 | Shimamura et al. | 29/740 |
| 8,151,448 | B2 * | 4/2012 | Vermeer et al. | 29/739 |
| 2005/0138801 | A1 * | 6/2005 | Theriault et al. | 29/832 |
| 2007/0047797 | A1 * | 3/2007 | Vilella | 382/141 |
| 2008/0257179 | A1 * | 10/2008 | Mattero et al. | 101/127.1 |
| 2010/0229380 | A1 * | 9/2010 | Endo et al. | 29/760 |
| 2012/0317798 | A1 * | 12/2012 | Kitagawa et al. | 29/739 |

FOREIGN PATENT DOCUMENTS

| | | |
|---|---|---|
| JP | 08-046399 A | 2/1996 |
| JP | 2000-165088 A | 6/2000 |
| JP | 2004-349280 A | 12/2004 |
| WO | 2004103051 A2 | 11/2004 |

OTHER PUBLICATIONS

International Search Report for PCT/JP2009/002876 dated Jul. 28, 2009.

* cited by examiner

US 9,084,385 B2

ELECTRONIC COMPONENT MOUNTING DEVICE AND WORK METHOD OF ELECTRONIC COMPONENT MOUNTING DEVICE

TECHNICAL FIELD

The present invention relates to an electronic component mounting device and a work method of electronic component mounting device, in which a plurality of work lines configured to perform a work related to mount of electronic component to a board independently of one another are provided in a space defined by a base and a cover member provided to cover an upper side of the base.

BACKGROUND ART

An electronic component mounting device (hereinafter referred to as a mounting device) configured to perform a work related to mount of electronic component (electronic component mount related work), such as a screen printing machine and an electronic component placement machine, includes one or more work lines provided on a base for conveying and positioning a board and for performing a necessary work to the board. By the work lines, screen printing of paste such as solder paste and conductive paste is performed on the board, and the electronic component is placed on the board printed with the paste. The work lines provided in the mounting device are provided in a single space defined by the base and a cover member. The cover member is provided with a door portion for allowing an operator of the mounting device to access an inside of the space (i.e., to access the work lines). When the plurality of work lines configured to perform the work related to mount of electronic component independently of one another are provided on the base, a door portion is provided for each of the work lines so as to allow an access to the corresponding work line.

When a check of the work line is needed during the operation of the mounting device, the operator performs the check work by opening the door portion for accessing the work line. From the view point of ensuring safety of the work by the operator, when the door portion is opened, the mounting device stops an operation of the work line accessible through the opened door portion by the operator (Patent Document 1). Therefore, in the related art mounting device including a plurality of work lines provided in a single space, operations of all of the work lines are stopped when one of the door portions is opened.

RELATED ART DOCUMENTS

Patent Documents

Patent Document 1: JP-A-2000-165088

SUMMARY OF THE INVENTION

Problem to be Solved by the Invention

In the related-art mounting device, when the door portion is opened, operations of all of the work lines are stopped. That is, in addition to the operation of the work line accessed by the operator, the operations of other work lines are stopped. In this case, although the safety of the work of the operator is ensured, the workability is significantly reduced.

An object of the present invention is to provide an electronic component mounting device and a work method of the electronic component mounting device, capable of ensuring the safety of the operator who accesses a work line through a door portion, and also capable of avoiding reduction of workability.

Means for Solving the Problem

An electronic component mounting device recited in claim 1 includes: a base; a cover member provided to cover an upper side of the base; a partition member configured to partition a space defined by the base and the cover member so as to define a plurality of work line storing spaces; a plurality of work lines which are stored in the respective work line storing spaces individually and which are configured to perform a work related to mount of electronic component to a board independently of one another; a plurality of door portions provided in the cover member so as to allow an access to an inside of the respective work line storing spaces individually; door open/close detection means for detecting open or close of each of the plurality of door portions; and work line stop means for stopping, when the open of any of the plurality of door portions is detected by the door open/close detection means, an operation of a work line stored in a work line storing space accessible through the door portion of which the open is detected.

An electronic component mounting device recited in claim 2 is the electronic component mounting device according to claim 1, wherein the partition member partitions the space defined by the base and the cover member so as to define a bypass conveying path storing space, and wherein a bypass conveying path is stored in the bypass conveying path storing space, the bypass conveying path being configured to convey the board from an upstream side to a down stream side without performing the work related to mount of electronic component.

A work method of an electronic component mounting device recited in claim 3, the electronic component mounting device in which a plurality of work lines configured to perform a work related to mount of electronic component to a board independently of one another are provided in a space defined by a base and a cover member provided to cover an upper side of the base, in which the space defined by the base and the cover member is partitioned by a partition member so as to define a plurality of work line storing spaces, and in which the plurality of work lines are stored in the respective work line storing spaces individually, the work method includes: a step of executing the work related to mount of electronic component to the board by the plurality of work lines concurrently; and a step of stopping, when any of a plurality of door portions provided in the cover member so as to allow an access to an inside of the respective work line storing spaces is opened, an operation of a work line stored in a work line storing space accessible through the opened door portion, wherein when the operation of the work line stored in the work line storing space accessible through the opened door portion is stopped, the rest of the plurality of work lines is enabled to execute the work related to mount of electronic component to the board.

A work method of an electronic component mounting device recited in claim 4 is the work method of an electronic component mounting device according to claim 3, wherein the partition member partitions the space defined by the base and the cover member so as to define a bypass conveying path storing space, wherein a bypass conveying path is stored in the bypass conveying path storing space, the bypass conveying path being configured to convey the board from an upstream side to a down stream side without performing the work related to mount of electronic component, and wherein even when any of the plurality of door portions is opened, an operation of the bypass conveying path is not stopped.

Advantages of the Invention

In the present invention, a space defined by a base and a cover member is partitioned by a partition member so as to define a plurality of work line storing spaces. A plurality of work lines are stored in the respective work line storing spaces individually. When any of a plurality of door portions provided in the cover member so as to allow an access to an inside of the respective work line storing spaces is opened, an operation of a work line stored in a work line storing space accessible through the opened door portion is stopped. With this configuration, when there is an opened door portion of the plurality of door portions, an operation of a work line stored in a work line storing space accessible through the opened door portion by the operator is stopped, whereby the safety of the work of the operator is ensured. Further, a work line stored in another work line storing space than the work line storing space S is not stopped, whereby the work can be continued, and the reduction of workability can be prevented.

MODE FOR CARRYING OUT THE INVENTION

Figure 1:
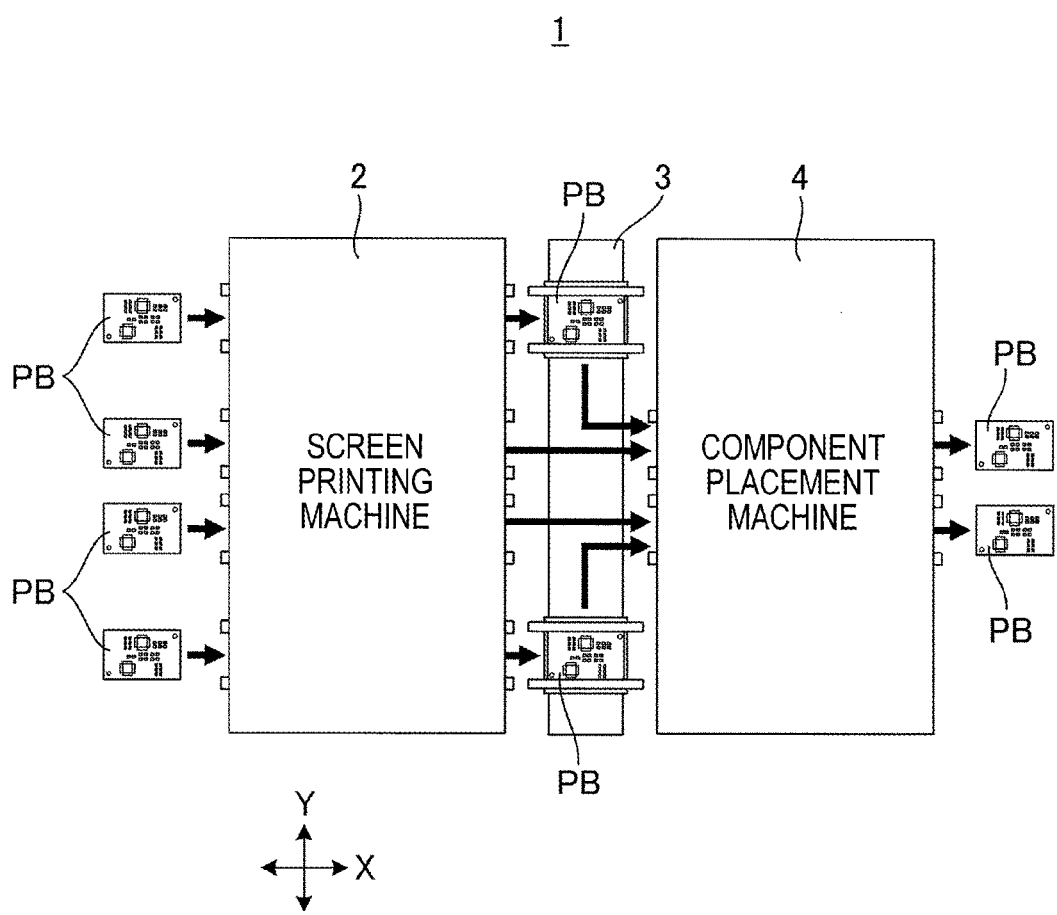
FIG. 1 is a configuration diagram of an electronic component mounting system according to an embodiment of the present invention.
Figure 4:
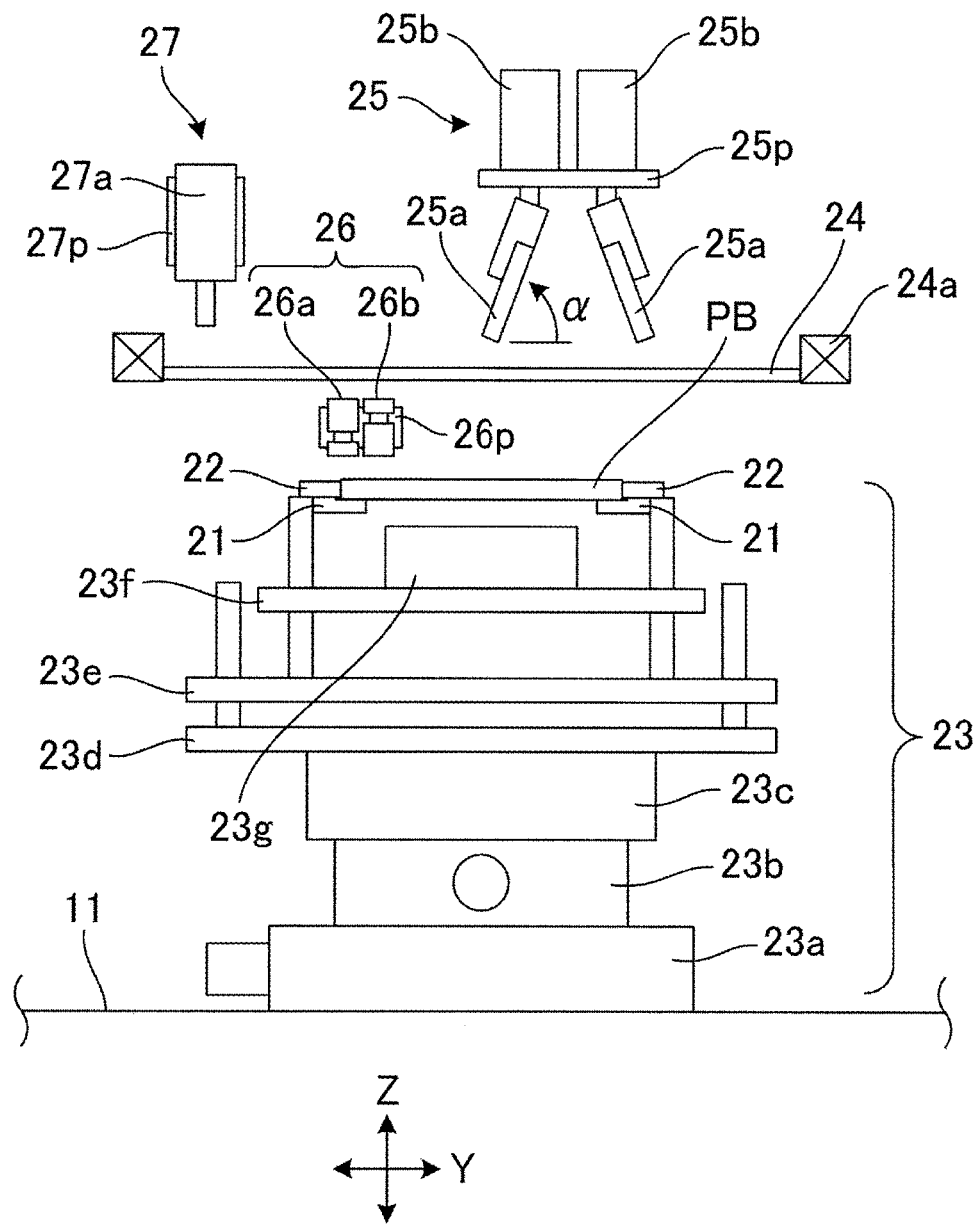
FIG. 4 is a front view of a printing device of the screen printing machine according to the embodiment of the present invention.
Figure 5:
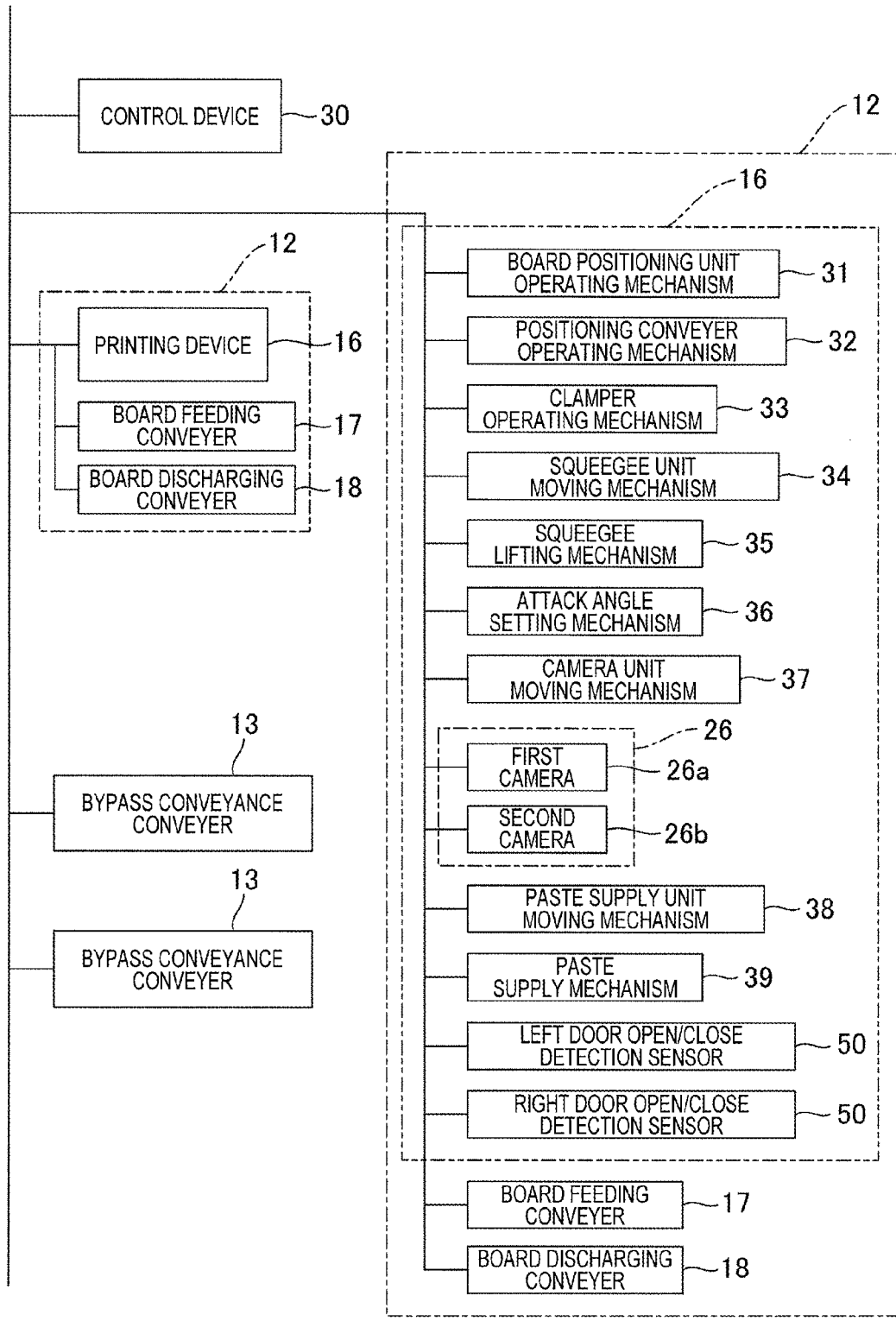
FIG. 5 is a block diagram showing a control system of the screen printing machine according to the embodiment of the present invention.

Hereinafter, an embodiment of the present invention is described with reference to the drawings. FIG. 1 is a configuration diagram of an electronic component mounting system according to an embodiment of the present invention, FIG. 2 is a partial cross-sectional front view of a screen printing machine according to the embodiment of the present invention, FIG. 3 is a partial cross-sectional front view of the screen printing machine and a board sorting conveyer according to the embodiment of the present invention, FIG. 4 is a front view of a printing device of the screen printing machine according to the embodiment of the present invention, FIG. 5 is a block diagram showing a control system of the screen printing machine according to the embodiment of the present invention, and FIGS. 6(a) and 6(b) and FIGS. 7(a) and 7(b) are operation diagrams of the printing device of the screen printing machine according to the embodiment of the present invention.

As shown in FIG. 1, an electronic component mounting system 1 of the embodiment includes a screen printing machine 2, a board sorting conveyer 3 and an electronic component placement machine 4. The screen printing machine 2 performs screen printing of paste such as solder paste and conductive paste on a board PB input from an upstream side (left side in FIG. 1), and outputs the board PB to a downstream side. The board sorting conveyer 3 sorts the board PB output from the screen printing machine 2 (the screen-printed board PB) for a conveyance designation, and inputs the board PB to the electronic component placement machine 4 located on the downstream side. The electronic component placement machine 4 places an electronic component on the board PB input from the board sorting conveyer 3, and outputs the board PB on the downstream side (right side in FIG. 1).

Figure 2:
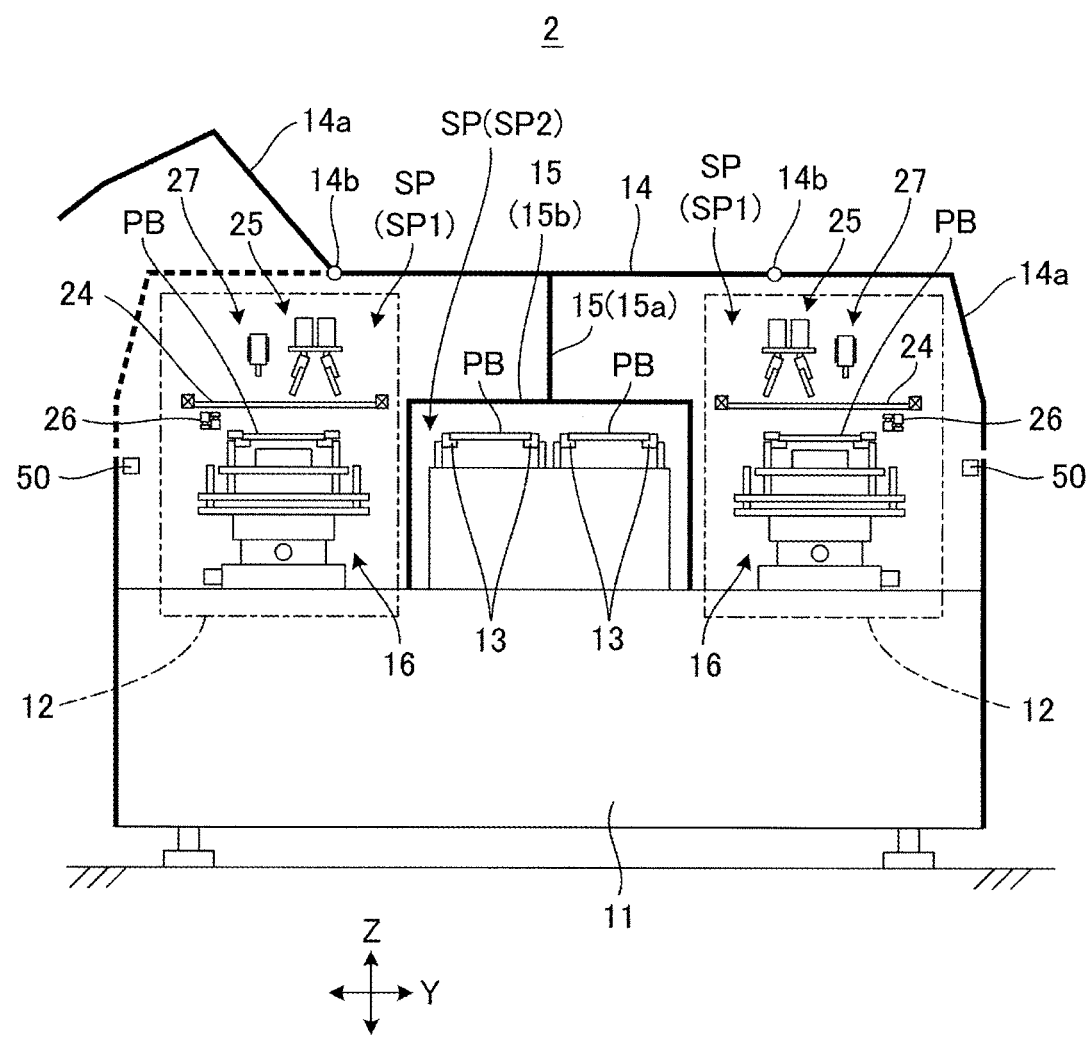
FIG. 2 is a partial cross-sectional front view of a screen printing machine according to the embodiment of the present invention.
Figure 3:
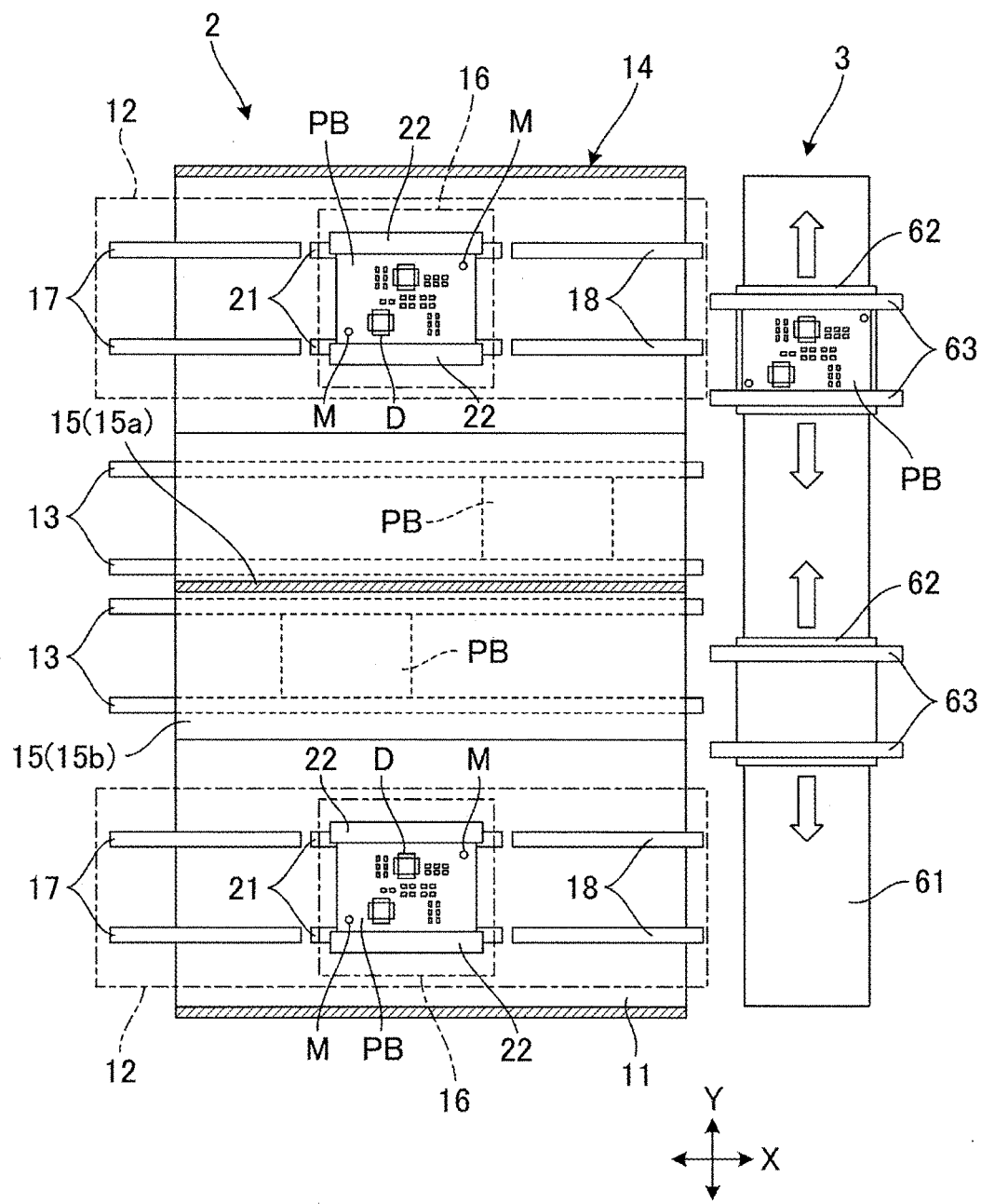
FIG. 3 is a partial cross-sectional front view of the screen printing machine and a board sorting conveyer according to the embodiment of the present invention.

As shown in FIG. 2 and FIG. 3, the screen printing machine 2 includes: a base 11; a plurality or work lines 12 which are provided on the base 11 and which are configured to convey and position the board PB and perform a work related to mount of electronic component to the board PB (screen printing, in this embodiment) independently of one another; and two bypass conveyance paths 13 configured to convey the board PB from the upstream side to the downstream side without performing the work related to mount of electronic component.

Each of the work lines 12 and each of the bypass conveyance paths 13 conveys the board PB in a same direction (one direction on a horizontal plane) which is referred to an X-axis direction in the following description. Also, a horizontal direction perpendicular to the X-axis direction is referred to as a Y-axis (right and left) direction. Further, a vertical direction is referred to as a Z-axis direction. As a matter of convenience of the description, the work line 12 on the left side in FIG. 2 is referred to as a left work line 12, and the work line 12 on the right side in FIG. 2 is referred to as a right work line 12.

On the base 11, a cover member 14 is provided to cover an upper side of the base 11. In a space defined by the base and the cover member 14, a plurality of partition members 15 (a first partition member 15a and a second partition member 15b) configured to partition the space so as to define two work line storing spaces SP1 and one bypass conveyance path storing space SP2. The two work lines 12 are individually stored in the respective work line storing spaces SP1 (FIG. 2).

As shown in FIG. 3, each of the work lines 12 includes: a printing device 16 configured to perform screen printing on the board PB; a board feeding conveyer 17 configured to feed the board PB to the printing device 16; and a board discharging conveyer 18 configured to discharge the screen-printed board PB from the printing device 16. The board feeding conveyer 17, the printing device 16 and the board discharging conveyer 18 are arranged in this order in the X-axis direction.

The two bypass conveyance paths 13 are stored in the one bypass conveyance path storing space SP2 (FIG. 2). As shown in FIG. 3, in this embodiment, each of the bypass conveyance paths 13 includes one belt conveyer (a pair of belt conveyers) having a length in the X-axis direction from the board feeding conveyer 17 to the board discharging conveyer 18 of each of the work lines 12. However, each of the bypass conveyance paths 13 may include a plurality of belt conveyers arranged in the X-axis direction.

In this embodiment, the two bypass conveyance paths 13 are stored in the one bypass conveyance path storing space SP2. However, the partition members 15 may define two bypass conveyance path storing spaces SP2, and the two bypass conveyance paths 13 may be individually stored in the respective bypass conveyance path storing spaces SP2. In other words, regarding the work lines 12, one work line 12 needs to be stored in one work line storing space SP1, but regarding the bypass conveyance paths 13, a plurality of bypass conveyance paths 13 may be stored in one bypass conveyance path storing space SP2.

As shown in FIG. 4, each of the printing devices 16 includes: a positioning conveyer 21 configured to receive the board PB from the board feeding conveyer 17, convey the board PB in a direction on the horizontal plane, and position the board PB; a clamper 22 configured to clamp the board PB on the positioning conveyer 21 by operating to open or close in the Y-axis direction, and fix the board PB on the positioning conveyer 21 (also see FIG. 3); a board positioning unit 23 configured to position the board PB in the direction on the horizontal plane and the vertical direction (Z-axis direction); a mask plate 24 provided on an upper side of the board positioning unit 23; a squeegee head 25; a camera unit 26 including a plurality of cameras (a first camera 26a and a second camera 26b); and a paste supply unit 27 configured to supply paste on the mask plate 24.

A shown in FIG. 4, the board positioning unit 23 includes: a Y-table 23a configured to move relative to the base 11 in the Y-axis direction; an X-table 23b configured to move relative to the Y-table 23a in the X-axis direction; a θ-table 23c configured to rotate relative to the X-table 23 around the Z-axis (on the horizontal plane); a base plate 23d fixed to the θ-table 23c; a first lifting plate 23e configured to be raised and lowered relative to the base plate 23d; a second lifting plate 23f configured to be raised and lowered relative to the first lifting plate 23e; and a board supporting block 23g fixed to the second lifting plate 23e.

The screen printing machine 2 includes a control device 30. The control device 30 performs operational control of a board positioning unit operating mechanism 31 (FIG. 5) for performing each of operations as follows: a move of the Y-table 23a relative to the base 11 in the Y-axis direction; a move of the X-table 23b relative to the Y-table 23a in the X-axis direction; a rotation of the θ-table 23c relative to the X-table 23b around the Z-axis; raise and lowering of the first lifting plate 23e relative to the base plate 23d (i.e., relative to the θ-table 23c); and raise and lowering of the second lifting plate 23f (i.e., the board supporting block 23g) relative to the first lifting plate 23e.

The control device 30 performs operational control of a positioning conveyer operating mechanism 32 (FIG. 5) for performing conveyance operation of the board PB by the positioning conveyer 21. The control device 30 performs operational control of a clamper operating mechanism 33 (FIG. 5) for performing clamping operation of the board PB on the positioning conveyer 21 by the clamper 22.

As shown in FIG. 4, four sides of the mask plate 24 is supported by a mask frame 24a having a rectangular shape in plan view. In an inner region of the mask plate 24 surrounded by the mask frame 24a, a large number of pattern pores are provided to correspond to shape and position of an electrode D (FIG. 1) formed on an upper surface of the board PB serving as an object to be printed.

The squeegee head 25 includes a moving plate 25p provided to be movable relative to the board positioning unit 23 in the direction on the horizontal plane, and two squeegees 25a opposing each other in the Y-axis direction and attached to the moving plate 25p. Each of the squeegees 25a is a member shaped like a "paddle" extending in the X-axis direction, and is configured to be raised and lowered relative to the moving plate 25p and to set an angle of attack. The angle of attack means an angle α between the squeegee 25a and the board PB or the mask plate 24 on the positioning conveyer 21 (FIG. 4). The control device 30 performs operational control of a squeegee unit moving mechanism 34 (FIG. 5) for performing move operation of the moving plate 25p. The control device performs operational control of a squeegee lifting mechanism 35 (FIG. 5) for operating each of squeegee lifting cylinders 25b (FIG. 4) in the vertical direction thereby performing raise and lowering operation of each of the squeegees 25a. The control device 30 performs operational control of an attack angle setting mechanism 36 (FIG. 5) for performing setting operation of the angle of attack of each of the squeegees 25a.

As shown in FIG. 4, the camera unit 26 includes a moving plate 26p provided to be movable relative to the board positioning unit 23 in the direction on the horizontal plane, and the first camera 26a having an image incident surface oriented downward and the second camera 26b having an image incident surface oriented upward which are attached to the moving plate 26p. The first camera 26a is configured to perform an image recognition of a board position detection mark M (FIG. 3) provided on the board PB positioned by the board positioning unit 23. The second camera 26b is configured to perform an image recognition of a mask position detection mark (not shown) provided on the mask plate 24. The control device 30 performs operational control of a camera unit moving mechanism 37 (FIG. 5) for performing a moving operation of the moving plate 26p. The control device 30 controls imaging operation of the first camera 26a and the second camera 26b, and image data obtained by imaging of the first camera 26a and the second camera 26b are input to the control device 30.

As shown in FIG. 4, the paste supply unit includes a moving plate 27p provided to be movable relative to the board positioning unit 23 in the direction on the horizontal plane, and a syringe 27a configured to downwardly eject paste to be printed on the board PB and attached to the moving plate 27p. The control device 30 performs operational control of a paste supply unit moving mechanism 38 (FIG. 5) for performing moving operation of the moving plate 27p. The control device 30 performs operational control of a paste supply mechanism 39 (FIG. 5) for performing supply operation of paste by the syringe 27a.

As shown in FIG. 2, the cover member 14 includes a plurality of door potions 14a so as to allow an access to an inside of the respective work line storing spaces SP1. Each of the cover members 14 forms a part of the cover member 14, and can be opened and closed around a hinge portion 14b serving as a fulcrum point in the vertical direction. The door portion 14a on the left side in FIG. 2 is configured to open the work line storing space SP1 storing the left work line 12 to the outside such that the operator of the screen printing machine 2 can access the left side work line 12. The door portion 14b on the right side in FIG. 2 is configured to open the work line storing space SP1 storing the right work line 12 to the outside such that the operator of the screen printing machine 2 can access the right side work line 12.

As shown in FIG. 2, a door open/close detection sensor 50 is provided on the cover member 14. The door open/close detection sensor 50 is configured to detect open or close of each of the door portions 14a. In this embodiment, since two door portions 14a are provided right and left so as to correspond to two work lines 12 in right and left, two door open/close detection sensors 50 are also provided in right and left. Each of the door open/close detection sensors 50 includes, for example, a limit switch. In this case, when the corresponding door portion 14a is in a closed state, a lever portion (not shown) contained in the door open/close detection sensor 50 is pressed by the door portion 14a, and the open/close detection sensor 50 outputs a door close signal. When the corresponding door portion 14a is in an opened state, the press to the lever portion by the door portion 14a is released, and the open/close detection sensor 50 outputs a door close signal. With this configuration, it is possible to detect open or close of the corresponding door portion 14a.

When the opened state of the door portion 14a is detected by the open/close detection sensor 50, the control device stops the operation of the work line 12 stored in the work line storing space SP1 accessible through the door portion 14a of which the opened state is detected. For example, when the opened state of the left door portion 14a is detected by the left door open/close detection sensor 50, the control device stops the operation of the left work line 12. Further, when the right door portion 14a is closed whereby a not-opened (i.e., closed) state of the right door portion 14a is detected by the right door open/close detection sensor 50, even when the opened state of the left door portion 14a is detected, the control device 30 does not stop the operation of the right work line 12.

The control device 30 controls conveyance (feed) operation of the board PB by the board feeding conveyer 17 (FIG. 5), whereby the board feeding conveyer 17 receives the board PB input from the upstream side of the screen printing machine 2, feeds the board PB into the screen printing machine 2, and delivers the board PB to the positioning conveyer 21. The control device 30 controls conveyance (discharge) operation of the board PB by the board discharging conveyer 18 (FIG. 5), whereby the board discharging conveyer 18 discharges the board PB received from the positioning conveyer 21 of the printing device 16 (i.e., the board PB printed with paste) to the outside of the screen printing machine 2.

When detecting the board PB conveyed from the upstream side, the control device 30 of the screen printing machine 2 operates the board feeding conveyer 17 to receive the board PB and to deliver the board PB to the positioning conveyer 21 of the printing device 16. When the positioning conveyer 21 of the printing device 16 receives the board PB, the second lifting plate 23f is raised relative to the first lifting plate 23e such that an upper surface of the board supporting block 23g contacts a lower surface of the board PB from a lower side, whereby the board PB is supported on the board supporting block 23g (FIG. 6(a)). When the board PB is supported on the board supporting block 23g, the control device 30 causes the clamper 22 to clamp the board PB so as to be fixed on the positioning conveyer 21.

When the board PB is fixed on the positioning conveyer 21, the control device 30 controls the move and imaging operations of the first camera 26a such that the first camera 26a performs the image recognition of the board position detection mark M of the board PB, thereby obtaining the position of the board PB. Further, the control device 30 controls the move and imaging operations of the second camera 26b such that the second camera 26b performs the image recognition of the mark position detection mark of the mask plate 24, thereby obtaining the position of the mask plate 24.

When obtaining the position of the board PB and the position of the mask plate 24, the control device 30 controls the move operation to the board PB by the board positioning unit 23 in the horizontal direction such that the board PB is positioned at a predetermined position immediately below the mask plate 24. Thereafter, the control device 30 controls the move operation to the board PB by the board positioning unit 23 in the vertical direction (i.e., raise of the first lifting plate 23e) such that the upper surface of the board PB contacts a lower surface of the mask plate 24 from the lower side.

Figure 6A:
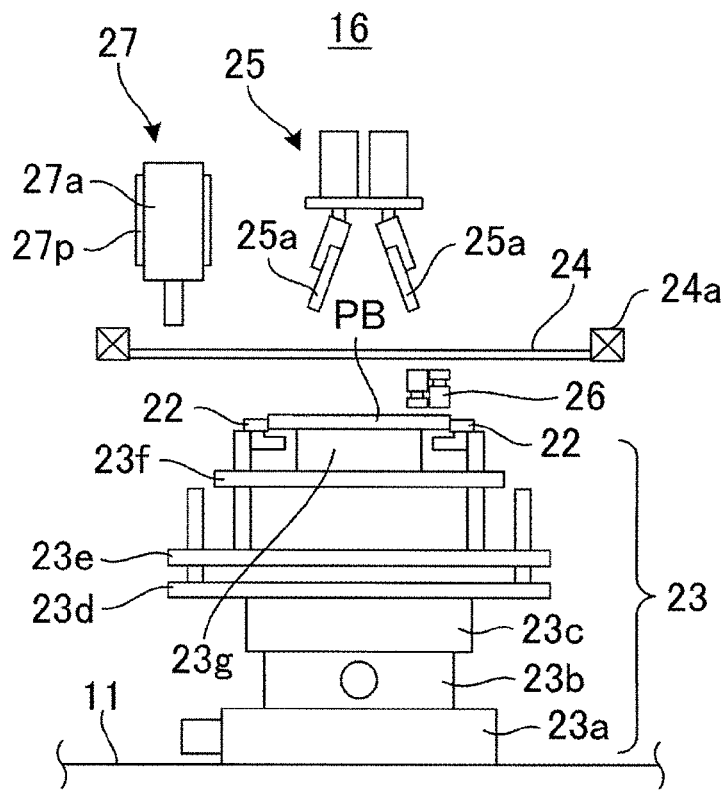
FIG. 6(a) and FIG. 6(b) are operation diagrams of the printing device of the screen printing machine according to the embodiment of the present invention.
Figure 6B:
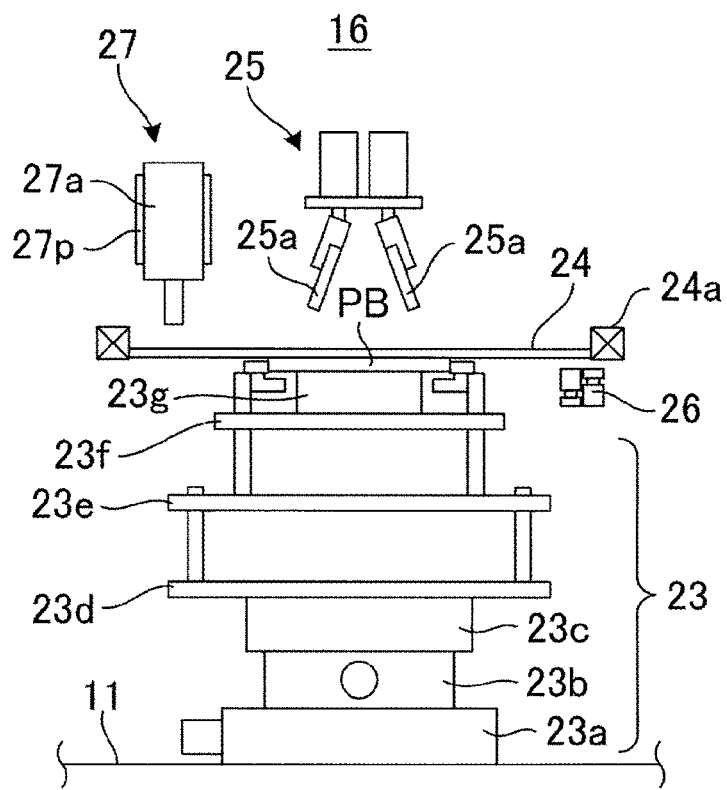

Consequently, the positioning of the board PB with respect to the mask plate 24 is finished (FIG. 6(b)).

When the positioning of the board PB with respect to the mask plate 24 is finished, the control device 30 executes screen printing on the board PB. The screen printing is executed by firstly moving the paste supply unit 27 on the upper side of the mask plate 24, and then supplying paste P to an upper surface of the mask plate 24 (FIG. 7(a)).

Figure 7A:
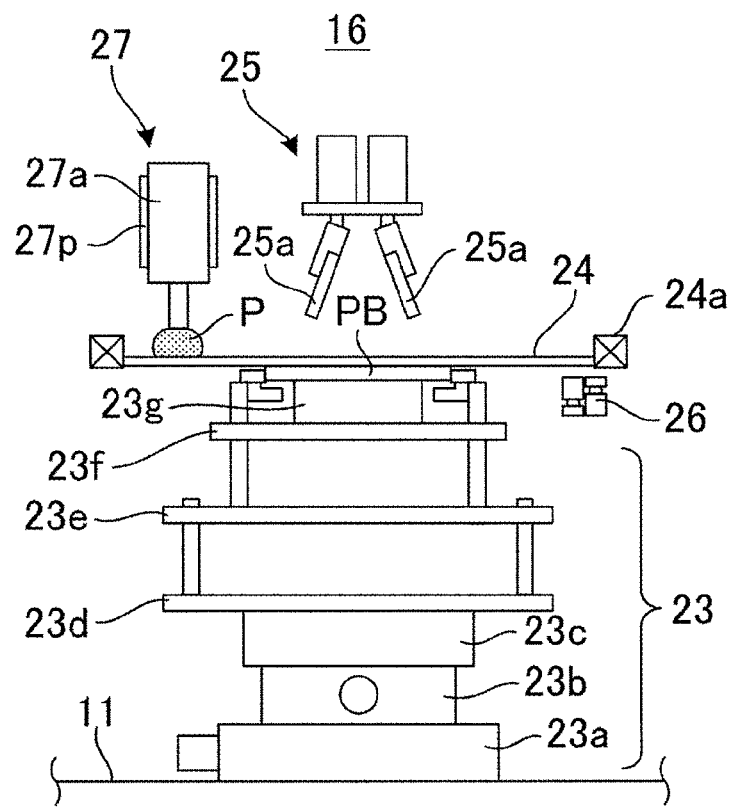
FIG. 7(a) and FIG. 7(b) are operation diagrams of the printing device of the screen printing machine according to the embodiment of the present invention.
Figure 7B:
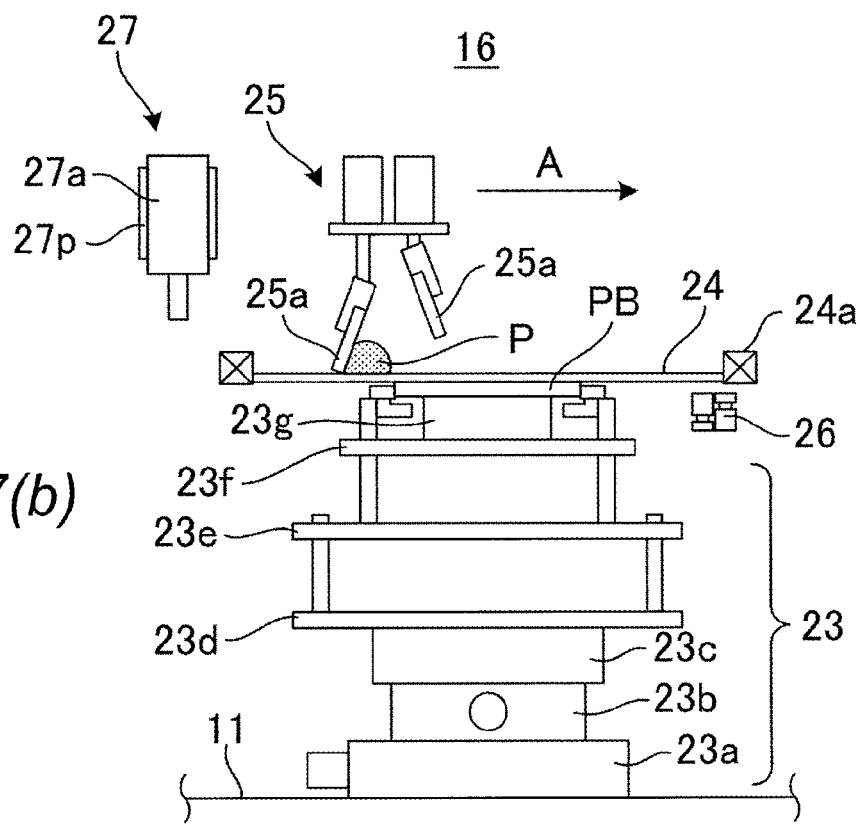

When the paste P is supplied to the upper surface of the mask plate 24, the control device 30 lowers one of the squeegees 25a such that a lower end of the one of the squeegees 25a contacts the upper surface of the mask plate 24 (FIG. 7(b)). Thereafter, the squeegee head 25 is moved in the Y-axis direction, whereby the paste P is swept by the squeegee 25a and filled in the pattern pores of the mask plate 24.

FIG. 7(b) shows that the past P is swept in a direction of an arrow A by moving the left squeegee 25a in the drawing in the direction of the arrow A. In contrast, it is possible to sweep the past P in a direction opposite to the direction of the arrow A by positioning the right squeegee 25a in the drawings so as to contact the upper surface of the mask plate 24, and moving the squeegee head 25 in the direction opposite to the direction of the arrow A.

When the paste P is filled in the pattern pores of the mask plate 24, the control device 30 lowers the second lifting plate 23f relative to the first lifting plate 23e so as to separate the mask plate 24 from the board PB. As a result, a so-called plate releasing is performed, and the paste P filled in the patter pores of the mask plate 24 is printed (transferred) on the board PB. The screen printing is performed at the two work lines 12 concurrently.

When the paste is printed on the board PB, the control device 30 operates the board positioning unit 23 so as to adjust a position of the positioning conveyer 21 relative to the board discharging conveyer 18, so as to transfer the board PB from the positioning conveyer 21 to the board discharging conveyer 18. Thereafter, the board discharging conveyer 18 is operated so as to discharge the board PB to the outside of the screen printing machine 2. The board PB discharged from the screen printing machine 2 is delivered to the board sorting conveyer 3 provided on the downstream side of the screen printing machine 2.

The control device 30 controls conveyance operation of the board PB by the two bypass conveyance paths 13 (FIG. 5). These two bypass conveyance paths 13 are provided separately from the two work lines 12, even during screen printing being performed on the board PB in the work liens 12, the bypass conveyance paths 13 allow the board PB to simply pass through the screen printing machine 2. That is, the bypass conveyance paths 13 receive the board PB input from the upstream side of the screen printing machine 2 and convey the board PB in the X-axis direction thereby outputting the board PB to the outside of the screen printing machine 2. The board PB output from the bypass conveyance paths 13 is delivered to the board sorting conveyer 3 provided on the downstream side of the screen printing machine 2, similar to the board PB output from the work lines 12.

As shown in FIG. 3, the board sorting conveyer 3 includes: a base 61 having a shape extending in the Y-axis direction of the screen printing machine 2; a plurality of (two, in this embodiment) plate members 62 provided to be movable on the base 61 in the Y-axis direction; and belt conveyers 63 provided on an upper surface of the respective plate members 62. The board sorting conveyer 3 moves each of the plate members 62 on the base 61 in the Y-axis direction (see outlined arrows shown in FIG. 3), and operates the belt conveyers 63 on the plate members 62, thereby receiving the board PB from the board discharging conveyers 18 of the work lines 12 or the bypass conveying paths 13 and then delivering the received board PB to the electronic component placement machine 4 provided on the downstream side of the board sorting conveyer 3.

As described above, the control device 30 concurrently executes screen printing by the screen printing machine 2 (the electronic component mount related work) in the two work lines 12 (executing step). When the operator feels the need to check the work line 12 during the execution of screen printing, the operator opens the door portion 14a for accessing the target work line 12 (the door portion 14a connected to the work line storing space SP1 storing the target work line 12). When the door portion 14a is opened thereby becoming in the opened state, the door open/close detection sensor 50 for the corresponding door portion 14a detects the opened state of the corresponding door portion 14a. Consequently, the control device 30 receives the detection result, and stops the operation of the work line 12 stored in the work line storing space SP1 accessible through the door portion 14a of which the opened state is detected (stopping step). Therefore, the operator can perform the check work safely. Even when the door portion 14a for one of the work lines 12 is opened, if the door portion 14a for another of the work lines 12 is not opened, the operation of another of the work lines 12 is not stopped. That is, the electronic component mount related work (screen printing on the board PB, in this embodiment) by the work line 12 not subjected to the check work continues to be performed.

As described above, the electronic component mounting device of this embodiment (the screen printing machine 2) includes: the base 11; the cover member 14 provided to cover the upper side of the base 11; the partition member 15 configured to partition the space defined by the base 11 and the cover member 14 so as to define the plurality of work line storing spaces SP1; the plurality of work lines 12 which are stored in the respective work line storing spaces SP1 individually and which are configured to perform the work related to mount of electronic component (screen printing) to the board PB independently of one another; the plurality of (right and left) door portions 14a provided in the cover member 14 so as to allow an access to an inside of the respective work line storing spaces SP1 individually; the right and left door open/close door sensors 50 serving as open/close detection means for detecting open or close of each of the door portions 14a; and the control device 30 serving as work line stop means for stopping, when the open of any of the plurality of (right and left) door portions 14a is detected by the door open/close sensor 50, the operation of the work line 12 stored in the work line storing space SP1 accessible through the door portion 14a of which the open is detected.

Further, the work method of the electronic component mounting device of this embodiment is a work method of the electronic component mounting device (the screen printing machine 2) in which the plurality of work lines 12 configured to perform the work related to mount of electronic component to the board PB independently of one another are provided in the space defined by the base 11 and the cover member 14 provided to cover the upper side of the base 11, in which the space defined by the base 11 and the cover member 14 is partitioned by the partition member 15 so as to define the plurality of work line storing spaces SP1, and in which the plurality of work lines 12 are stored in the respective work line storing spaces SP1 individually. The work method includes: a step of executing the work related to mount of electronic component to the board PB by the plurality of work lines 12 concurrently (the above-described executing step); and a step of stopping, when any of the plurality of door portions 14a provided in the cover member 14 so as to allow an access to the inside of the respective work line storing spaces SP1 is opened, the operation of the work line 12 stored in the work line storing space SP1 accessible through the opened door portion 14a, wherein when the operation of the work line 12 stored in the work line storing space SP1 accessible through the opened door portion 14a is stopped, the rest of the plurality of work lines 12 is enabled to execute the work related to mount of electronic component to the board PB.

According to the electronic component mounting device (the screen printing machine 2) and the work method of the electronic component mounting device, the space defined by the base 11 and the cover member 14 is partitioned by the partition member 15 so as to define the plurality of work line storing spaces PS1. The plurality of work lines 12 are stored in the respective work line storing spaces SP1 individually. When any of the plurality of door portions 14a provided in the cover member 14 so as to allow an access to the inside of the respective work line storing spaces SP1 is opened, the operation of the work line 12 stored in the work line storing space SP1 accessible through the opened door portion 14a is stopped. With this configuration, when there is an opened door portion 14a of the plurality of door portions 14a, the operation of the work line 12 stored in the work line storing space SP1 accessible through the opened door portion 14a by the operator is stopped, whereby the safety of the work of the operator is ensured. Further, the work line 12 stored in another work line storing space SP1 than the work line storing space SP1 is not stopped, whereby the work can be continued, and the reduction of workability can be prevented.

An entire portion or a part of partition member 15 is preferably formed of transparent material such that when the door portion 14a is opened, the operator can visually check not only the operating state of the work line 12 in the work line storing space SP1 accessible through the opened door portion 14 but also the operating state of the work line 12 stored in another work lien storing space SP1.

Further, in the electronic component mounting device and the work method of the electronic component mounting device according to this embodiment, the partition member 15 partitions the space defined by the base 11 and the cover member 14 so as to define the bypass conveying path storing space SP2. The bypass conveying path 13 is stored in the bypass conveying path storing space SP2, the bypass conveying path 13 being configured to convey the board PB from the upstream side to the down stream side without performing the work related to mount of electronic component. Even when any of the plurality of door portions 14a is opened, an operation of the bypass conveying path is not stopped. Consequently, even when the door portion 14a is opened and hence the work line 12 is stopped, the operation of the bypass conveying path 13 is not stopped, whereby the work for the board PB simply passing through the electronic component mounting device (the screen printing machine 2) is not interrupted.

Although the embodiment of the present invention is described above, the present invention is not limited to the above-described embodiment. For example, the above-described embodiment shows, as an example of the electronic component mounting device, the screen printing machine 2 configured to perform screen printing of the past on the board PB. However, the electronic component mounting device may be one configured to perform the work related to mount of electronic component. That is, the electronic component mounting device is not limited to the screen printing machine 2, and may be the electronic component placement machine configured to place the electronic component on the board PB, an inspection machine configured to perform visual inspection of the board PB, etc. Further, in the above-described embodiment, the number of work lines 12 configured to perform the work related to mount of electronic component to the board PB independently is two. However, the number of the work lines 12 may be plural, and three or more. Moreover, in the above-described embodiment, the number of the work line storing spaces SP1 defined by the partition member 15 is two. This is because the number of the work lines 12 on the base 11 is two. If the number of the work lines 12 on the base is three or more, the number of the work line storing spaces SP1 is also three or more, in association with the number of the work lines 12.

While the present invention has been described with reference to the specific embodiment in detail, it will be apparent to a person having ordinary skill in the art that various changes or modifications may be made without departing from the spirit and scope of the present invention.

This application is based on Japanese patent application (Application No. 2008-226626) filed on Sep. 4, 2008, the entire contents of which are incorporated herein by reference.

INDUSTRIAL APPLICABILITY

There is provided an electronic component mounting device and a work method of the electronic component mounting device, capable of ensuring safety of an operator who accesses a work line through a door portion, and also avoiding reduction of workability.

DESCRIPTION OF REFERENCE SIGNS

2: Screen Mounting Machine (Electronic Component Mounting Device)
11: Base
12: Work Line
13: Bypass Conveyance Path
14: Cover Member
14a: Door Portion
15: Partition Member
30: Control Device (Work Line Stop Means)
50: Door Open/Close Detection Sensor (Door Open/Close Detection Means)
SP1: Work Line Storing Space
SP2: Bypass Conveyance Path Storing Space
PB: Board

The invention claimed is:

1. An electronic component mounting device comprising:
a base;
a cover member provided to cover an upper side of the base;
a partition member configured to partition a space defined by the base and the cover member so as to define a plurality of work line storing spaces;
a plurality of work lines which are stored in the respective work line storing spaces individually and which are configured to perform a work related to mount of electronic component to a board independently of one another;
a plurality of door portions provided in the cover member so as to allow an access to an inside of the respective work line storing spaces individually;
door open/close detection means for detecting open or close of each of the plurality of door portions; and
work line stop means for stopping, when the open of any of the plurality of door portions is detected by the door open/close detection means, an operation of a work line stored in a work line storing space accessible through the door portion of which the open is detected,
wherein the partition member partitions the space defined by the base and the cover member so as to define a bypass conveying path storing space, and
wherein a bypass conveying path is stored in the bypass conveying path storing space, the bypass conveying path being configured to convey the board from an upstream side to a down stream side without performing the work related to mount of electronic component.

2. A work method of an electronic component mounting device, the electronic component mounting device in which a plurality of work lines configured to perform a work related to mount of electronic component to a board independently of one another are provided in a space defined by a base and a cover member provided to cover an upper side of the base, in which the space defined by the base and the cover member is partitioned by a partition member so as to define a plurality of work line storing spaces, and in which the plurality of work lines are stored in the respective work line storing spaces individually,
said work method comprising:
a step of executing the work related to mount of electronic component to the board by the plurality of work lines concurrently; and
a step of stopping, when any of a plurality of door portions provided in the cover member so as to allow an access to an inside of the respective work line storing spaces is opened, an operation of a work line stored in a work line storing space accessible through the opened door portion,
wherein when the operation of the work line stored in the work line storing space accessible through the opened door portion is stopped, the rest of the plurality of work lines is enabled to execute the work related to mount of electronic component to the board.

3. The work method of an electronic component mounting device according to claim 2,
wherein the partition member partitions the space defined by the base and the cover member so as to define a bypass conveying path storing space,
wherein a bypass conveying path is stored in the bypass conveying path storing space, the bypass conveying path being configured to convey the board from an upstream side to a down stream side without performing the work related to mount of electronic component, and
wherein even when any of the plurality of door portions is opened, an operation of the bypass conveying path is not stopped.

* * * * *